(12) United States Patent
Li

(10) Patent No.: US 12,224,216 B2
(45) Date of Patent: Feb. 11, 2025

(54) MODEL PARAMETER TEST STRUCTURES FOR TRANSISTORS AND PREPARATION METHODS THEREOF

(71) Applicant: CHANGXIN MEMORY TECHNOLOGIES, INC., Anhui (CN)

(72) Inventor: Guochao Li, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 705 days.

(21) Appl. No.: 17/310,898

(22) PCT Filed: Mar. 24, 2021

(86) PCT No.: PCT/CN2021/082607
§ 371 (c)(1),
(2) Date: Aug. 28, 2021

(87) PCT Pub. No.: WO2021/190539
PCT Pub. Date: Sep. 30, 2021

(65) Prior Publication Data
US 2022/0319936 A1    Oct. 6, 2022

(30) Foreign Application Priority Data
Mar. 26, 2020   (CN) .......................... 202010224334.2

(51) Int. Cl.
*H01L 21/66*    (2006.01)
*G01R 31/26*    (2020.01)

(52) U.S. Cl.
CPC .......... *H01L 22/34* (2013.01); *G01R 31/2601* (2013.01); *G01R 31/2607* (2013.01)

(58) Field of Classification Search
CPC ... H01L 22/34; H01L 23/544; G01R 31/2601; G01R 31/2607
(Continued)

(56) References Cited

U.S. PATENT DOCUMENTS 7,132,683 B1    11/2006   Krishnan et al.
7,973,372 B2     7/2011   Bahl et al.
(Continued)

FOREIGN PATENT DOCUMENTS

CN    101807603 A  *  8/2010
CN    102945841 A  *  2/2013
(Continued)

OTHER PUBLICATIONS

International Search Report (ISR) in Application No. PCT/CN2021/082607 mailed on Jun. 29, 2021.

*Primary Examiner* — Mohammad M Hoque
(74) *Attorney, Agent, or Firm* — Syncoda LLC; Feng Ma

(57) ABSTRACT

A model parameter test structure for a transistor includes: a substrate, having a first conductivity type, a plurality of isolation structures being provided in the substrate and the isolation structures being used to isolate different doped regions; a first test device, formed in the substrate and configured to obtain characteristic parameters of a source side of the transistor; and a second test device, formed in the substrate and configured to obtain characteristic parameters of a drain side of the transistor; wherein a structure of the first test device is different from a structure of the second test device.

11 Claims, 7 Drawing Sheets

(58) Field of Classification Search
USPC .......................................................... 257/48
See application file for complete search history.

(56) References Cited

U.S. PATENT DOCUMENTS

| | | | |
|---|---|---|---|
| 8,633,082 B2 | 1/2014 | Lasserre et al. | |
| 2008/0308864 A1 | 12/2008 | Lin | |
| 2010/0244150 A1* | 9/2010 | Bahl | ................ H01L 29/66659 |
| | | | 257/408 |

FOREIGN PATENT DOCUMENTS

| | | | |
|---|---|---|---|
| CN | 102956620 A | * | 3/2013 |
| CN | 205789954 U | | 12/2016 |
| CN | 107290594 A | | 10/2017 |
| CN | 108155111 A | | 6/2018 |

* cited by examiner

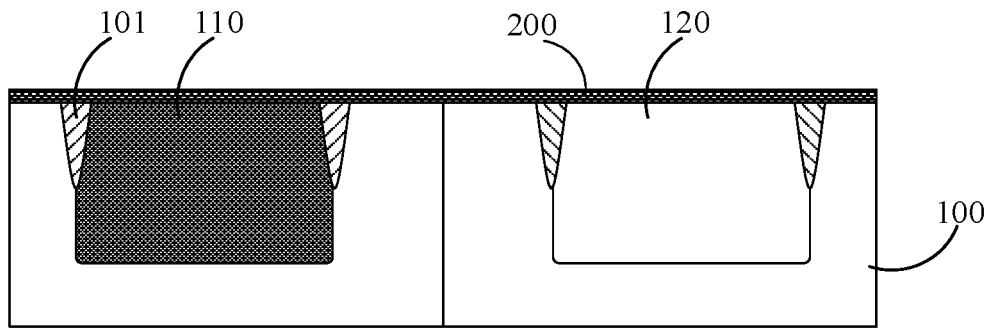

FIG. 6

| Form a first well region, a second well region, a third well region, and a fourth well region in the substrate, a side surface of the second well region being isolated from the first well region via the isolation structure and a side surface of the fourth well region being isolated from the third well region via the isolation structure | S210 |

↓

| Form a first heavily doped region in the second well region, and form a fourth heavily doped region in the fourth well region | S220 |

↓

| Form a lightly doped region in the second well region, two side surfaces of the lightly doped region being respectively isolated from the first heavily doped region and the second well region via the isolation structure | S230 |

↓

| Form a third heavily doped region in the first well region, form a second heavily doped region in the second well region, form a sixth heavily doped region in the third well region, and form a fifth heavily doped region in the fourth well region | S240 |

FIG. 7

MODEL PARAMETER TEST STRUCTURES FOR TRANSISTORS AND PREPARATION METHODS THEREOF

CROSS-REFERENCE TO RELATED APPLICATIONS

This application is a national stage of International Application No. PCT/CN2021/082607 filed on Mar. 24, 2021, which claims priority to Chinese Patent Application No. 202010224334.2 filed on Mar. 26, 2020. The disclosures of these applications are hereby incorporated by reference in their entirety.

TECHNICAL FIELD

The present disclosure relates to the technical field of transistor manufacturing, and in particular to a model parameter test structure for a transistor and a preparation method thereof.

BACKGROUND

With the continuous development of semiconductor technology, the development of integrated circuits has become the manufacturing of a few connected devices on a single chip to millions of devices, and the performance and complexity of the current integrated circuits have also been increasing. As the most basic devices in semiconductor manufacturing, various transistors have been widely used in integrated circuits. Therefore, higher requirements are put forward for the circuit design and manufacturing process of transistors.

In order to accurately obtain the design and manufacturing status of a transistor, technicians usually extract the electrical parameters of the transistor and use the extracted parameters to perform simulation to confirm whether the transistor meets the index requirements. Specifically, the external test structure (testkey) is a structure used to extract the electrical parameters of the transistors. The extracted parameters are used to establish an electrical model of a field effect transistor, and then the electrical model is used for simulation and analysis to obtain performance parameters such as output resistance and parasitic capacitance of the transistor.

At present, the commonly used external test structure can accurately obtain the electrical parameters of conventional transistors. However, when the existing external test structure is used for special transistors such as asymmetric transistors, the accuracy of the extracted electrical parameters may be insufficient due to the device structure, which affects the accuracy of the simulation and analysis results of the electrical model.

SUMMARY

One aspect of the present disclosure provides a model parameter test structure for a transistor, comprising:
a substrate, having a first conductivity type, a plurality of isolation structures being provided in the substrate and the isolation structures being used to isolate different doped regions;
a first test device, formed in the substrate and configured to obtain characteristic parameters of a source side of the transistor; and
a second test device, formed in the substrate and configured to obtain characteristic parameters of a drain side of the transistor;
wherein, a structure of the first test device is different from a structure of the second test device.

Another aspect of the present disclosure provides a method for preparing a model parameter test structure for a transistor, comprising:
providing a substrate having a first conductivity type, a plurality of isolation structures being provided in the substrate;
forming a first test device and a second test device in the substrate, the first test device being configured to obtain characteristic parameters of a source side of the transistor and the second test device being configured to obtain characteristic parameters of a drain side of the transistor;
wherein, a structure of the first test device is different from a structure of the second test device.

The details of one or more embodiments of the present disclosure will be set forth in the following drawings and description. Other features, purposes and advantages of the present disclosure will become apparent from the description, drawings and claims.

BRIEF DESCRIPTION OF THE DRAWINGS

In order to better describe and illustrate the embodiments of the present disclosure, reference may be made to one or more drawings. However, the additional details or examples used to describe the drawings should not be considered as any limitation to the concept of the present disclosure or any one of the currently described embodiments or preferred implementations.

FIG. 6 is a schematic structure diagram of the device after the step S200 in an embodiment;

FIG. 7 is a flowchart of forming the first test device 110 and the second test device 120 in the substrate in an embodiment;

Figure 1:
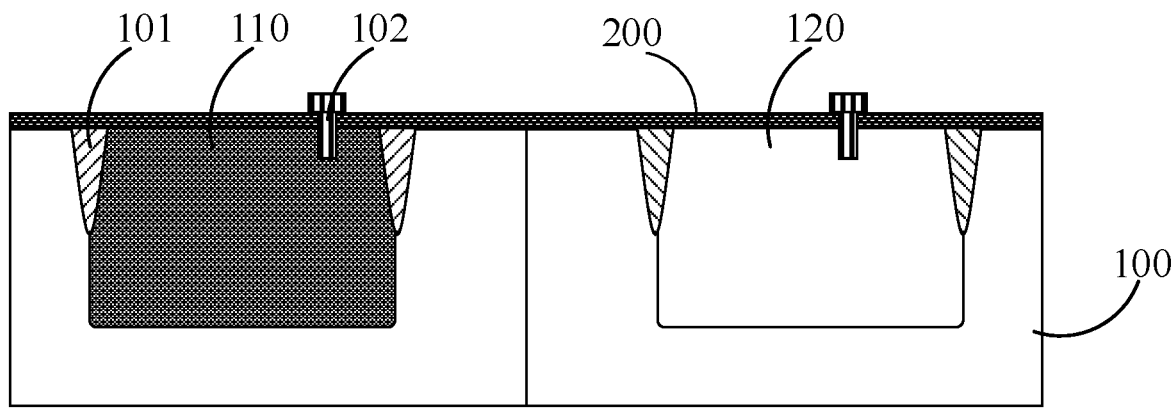
FIG. 1 is a schematic diagram of a model parameter test structure for a transistor in an embodiment.

REFERENCE NUMERALS substrate: 100; isolation structure: 101; substrate-side pad: 102; first test device: 110; second test device: 120; first well region: 111; second well region: 112; third well region: 121; fourth well region: 122; first heavily doped region: 1121; second heavily doped region: 1122; third heavily doped region: 1111; fourth heavily doped region: 1221; fifth heavily doped region: 1222;

sixth heavily doped region: 1211; lightly doped region: 1123; passivation layer: 200.

DETAILED DESCRIPTION

In order to facilitate the understanding of the present disclosure, the present disclosure will be described more fully below with reference to the relevant drawings. Preferred embodiments of the present disclosure are shown in the drawings. However, the present disclosure may be implemented in many different forms and is not limited to the embodiments described herein. On the contrary, these embodiments are provided to make the disclosure of the present disclosure more thorough and comprehensive.

Unless otherwise defined, all technical and scientific terms used herein have the same meaning as commonly understood by a person of ordinary skill in the art to which the present disclosure belongs. Here, terms used in the description of the present disclosure are merely intended to describe specific embodiments, rather than limiting the present disclosure. As used herein, the term "and/or" includes any or all of one or more associated listed items or combinations thereof.

In the description of the present disclosure, it should be understood that orientations or location relationships indicated by terms such as "upper", "lower", "vertical", "horizontal", "inner", "outer" are the directions and the location relationships illustrated on the basis of the drawings, and used just for convenience of describing the present disclosure and simplifying the description, rather than indicating or implying that the devices or elements must have a specific orientation and be constructed and operated in the specific orientation, and therefore shall not be considered as any limitations to the present disclosure.

FIG. 1 is a schematic diagram of a model parameter test structure for a transistor in an embodiment. As shown in FIG. 1, the model parameter test structure comprises a substrate 100, a first test device 110 and a second test device 120.

The substrate 100 has a first conductivity type, a plurality of isolation structures 101 are provided in the substrate 100, and the isolation structures 101 are used to isolate different doped regions.

The different doped regions refer to doped regions where the parameters of the doping process are different. The parameters of the doping process comprise, but are not limited to, doping elements, doping concentration, doping depth, etc. Doping predetermined elements in intrinsic semiconductors may form N-type semiconductors or P-type semiconductors, and the first conductivity type is N-type or P-type.

Specifically, in this embodiment, isolating the different doped regions via the isolation structures 101 can, on one hand, prevent ion diffusion between adjacent doped regions, thereby avoiding the change in the conductivity of the doped regions; and on the other hand, avoid leakage current between adjacent doped regions. Therefore, the test structure in this embodiment has high stability and reliability. Optionally, the isolation structures 101 are shallow trench isolation structures.

The first test device 110 is formed in the substrate 100 and configured to obtain characteristic parameters of a source side of a transistor; and the second test device 120 is formed in the substrate 100 and configured to obtain characteristic parameters of a drain side of the transistor, wherein, the structure of the first test device 110 is different from that of the second test device 120.

The transistor is an asymmetric transistor to be tested in this embodiment. The asymmetric transistor may be a field effect transistor with an asymmetric structure, that is, a field effect transistor with different device structures at its source and drain. The asymmetric transistor may be a transistor in a dynamic random-access memory.

Specifically, the test device and the transistor in this embodiment are prepared synchronously, that is, the same process parameters and conditions are used for the corresponding layers of the test device and the transistor. Therefore, the characteristic parameters extracted from the test device may be used to accurately establish a simulation model of the transistor. Further, this embodiment is directed to transistors with an asymmetric structure, that is, transistors with different functional layers on the source side and the drain side and with different processes in the manufacturing process. The use of the same test device on the source and drain sides will lead to deviations in the extraction of characteristic parameters. Therefore, in this embodiment, corresponding test devices with different structures are provided for the source side and the drain side, so that the test devices can accurately reflect the characteristics of the device structure on the corresponding side, thereby improving the accuracy of the simulation model established by the extracted characteristic parameters.

The model parameter test structure for a transistor comprises: a substrate 100 having a first conductivity type, a plurality of isolation structures 101 being provided in the substrate 100 and the isolation structures 101 being used to isolate different doped regions; a first test device 110 formed in the substrate 100 and configured to obtain characteristic parameters of a source side of a transistor; and a second test device 120 formed in the substrate 100 and configured to obtain characteristic parameters of a drain side of the transistor; wherein, the structure of the first test device 110 is different from that of the second test device 120. For transistors with asymmetric structures, in this embodiment, by the first test device 110 and the second test device 120 correspondingly prepared based on different device structures on the source side and the drain side, the model parameter extraction error caused by the test structure is reduced, the accuracy of extracting characteristic parameters on the source and drain sides of the transistor is improved.

In an embodiment, the structural difference between the first test device 110 and the second test device 120 matches the structural difference between the source side and the drain side of the transistor to be tested. Specifically, the structural difference matching means that, for example, assuming that the doping concentration of a set region on the source side of the transistor to be tested is A and the doping concentration of a region corresponding to the set region on the drain side of the transistor to be tested is B, then a set of corresponding regions is provided in the first test device 110 and the second test device 120 and the doping concentration is A and B, respectively. Or, for example, if one more doped region is provided on the source side than the drain side of the transistor to be tested, then one more doped region having the same doping characteristics as this doped region is provided in the first test device 110 than in the second test device 120. Further, in a field effect transistor with an asymmetric structure, usually, one more lightly doped region is provided on the source side than the drain side. By the structural difference matching in this embodiment, the design difficulty of the test structure is reduced, and meanwhile, the characteristic parameters of the source and drain of the transistor are accurately obtained.

In an embodiment, the first test device 110 and the second test device 120 are both junction diodes. The junction diode has a variety of characteristic parameters, for example volt-ampere characteristics, forward characteristics, reverse characteristics, breakdown characteristics, etc. Therefore, the connection of external test devices to the first test device 110 and the second test device 120 in a set test manner can accurately obtain multiple performance parameters of the test devices, so as to obtain the characteristic parameters of the source and drain, which are then used for electrical simulations.

Further, the diode is a semiconductor device with a simple structure. On the basis of being able to realize the test function, the use of a relatively simple diode device structure can reduce the difficulty in preparing the first test device 110 and the second test device 120, and reduce the failure of the test devices. Therefore, the test efficiency of the test structure in this embodiment is improved.

Figure 2:
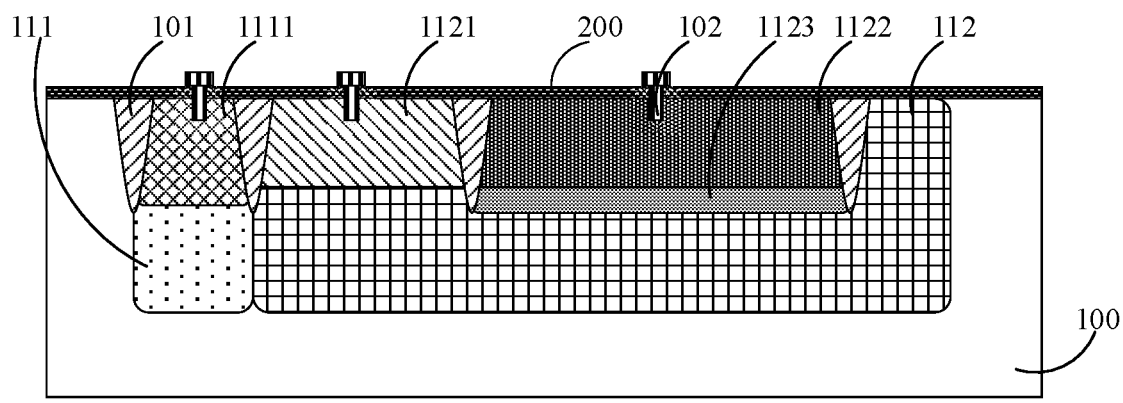
FIG. 2 is a schematic structure diagram of a first test device 110 in an embodiment.

FIG. 2 is a schematic structure diagram of a first test device 110 in an embodiment. As shown in FIG. 2, the first test device 110 comprises: a first well region 111, having a first conductivity type and being formed in the substrate 100; a second well region 112, having a second conductivity type and being formed in the substrate 100, a side surface of the second well region 112 being isolated from the first well region 111 via the isolation structure 101; a first heavily doped region 1121, having the second conductivity type and being formed in the second well region 112; a second heavily doped region 1122, having the first conductivity type and being formed in the second well region 112, two side surfaces of the second heavily doped region 1122 being respectively isolated from the first heavily doped region 1121 and the second well region 112 via the isolation structure 101; a third heavily doped region 1111, having the first conductivity type and being formed in the first well region 111; and a lightly doped region 1123 formed in the second well region 112, the lightly doped region 1123 being located on a lower side of the second heavily doped region 1122, and two side surfaces of the lightly doped region 1123 being respectively isolated from the first heavily doped region 1121 and the second well region 112 via the isolation structure 101.

Figure 3:
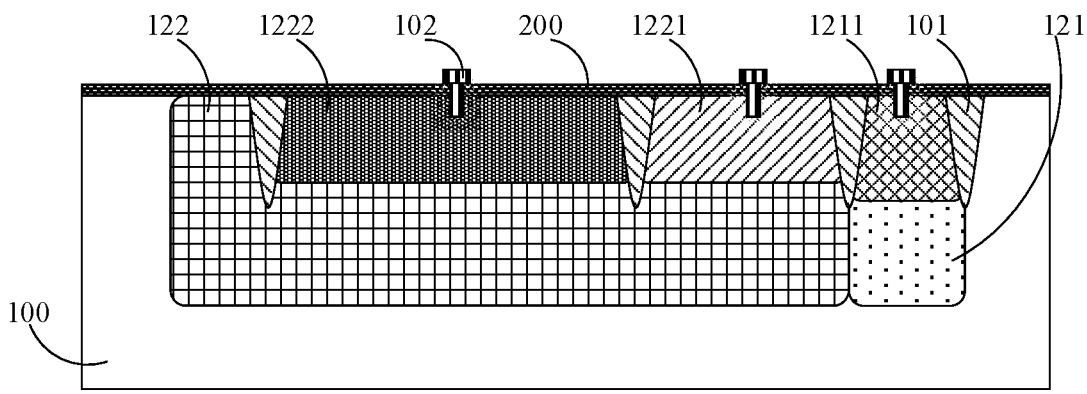
FIG. 3 is a schematic structure diagram of a second test device 120 in an embodiment.

FIG. 3 is a schematic structure diagram of a second test device in an embodiment. As shown in FIG. 3, the second test device 120 comprises: a third well region 121, having the first conductivity type and being formed in the substrate 100; a fourth well region 122, having a second conductivity type and being formed in the substrate 100, a side surface of the fourth well region 122 being isolated from the third well region 121 via the isolation structure 101; a fourth heavily doped region 1221, having the second conductivity type and being formed in the fourth well region 122; a fifth heavily doped region 1222, having the first conductivity type and being formed in the fourth well region 122, two side surfaces of the fifth heavily doped region 1222 being respectively isolated from the fourth heavily doped region 1221 and the fourth well region 122 via the isolation structure 101; and a sixth heavily doped region 1211, having the first conductivity type and being formed in the third well region 121.

Specifically, in the above-mentioned embodiment of the first test device 110, the first well region 111, the second well region 112, the first heavily doped region 1121, the second heavily doped region 1122, and the third heavily doped region 1111 constitute a basic junction diode structure. In the above-mentioned embodiment of the second test device 120, the third well region 121, the fourth well region 122, the fourth heavily doped region 1221, the fifth heavily doped region 1222, and the sixth heavily doped region 1211 constitute a basic junction diode structure; and the lightly doped region 1123 in the first test device 110 matches, as the structural difference of the device, the structural difference between the source side and the drain side of the transistor. Thus, the extraction of characteristic parameters on the source side and the drain side is realized. The junction diode device in this embodiment has a simple structure, is easy to manufacture, and has high device stability and reliability. Moreover, by the lightly doped region 1123 provided only in the first test device 110, it is possible to accurately obtain the characteristic parameters on the source and drain sides, respectively.

In an embodiment, as shown in FIGS. 1 to 3, the model parameter test structure further comprises: a passivation layer 200 formed on the surface of the substrate 100 to protect the substrate; and a substrate-side pad 102, one end of which is connected to a set region in the first test device 110 or the second test device 120 and the other end extends to the surface of the passivation layer 200, used for lapping parameter test probes. The set region in the first test device 110 or the second test device 120 is the set doped region in the test device. The parameter test probes are probes of the external test device. The parameter test probes can obtain the electrical performance of the test device by contacting the substrate-side pad 102.

In an embodiment, as shown in FIG. 2, the first test device 110 is connected to three substrate-side pads 102 which are respectively connected to the first heavily doped region 1121, the second heavily doped region 1122 and the third heavily doped region 1111. It should be noted that the number of substrate-side pads 102 in the first test device 110 may be determined according to the design model for electrical simulations. Therefore, for different electrical simulation models, a corresponding number of substrate-side pads 102 need to be provided. The number of substrate-side pads is not limited to 3 in this embodiment.

In an embodiment, as shown in FIG. 3, the second test device 120 is connected to three substrate-side pads 102 which are respectively connected to the fourth heavily doped region 1221, the fifth heavily doped region 1222 and the sixth heavily doped region 1211. It should be noted that the number of substrate-side pads 102 in the second test device 120 may be determined according to the design model for electrical simulations. Therefore, for different electrical simulation models, a corresponding number of substrate-side pads 102 need to be provided. The number of substrate-side pads is not limited to 3 in this embodiment.

In an embodiment, the first conductivity type is P-type. Specifically, the first conductivity type is P-type, and the second conductivity type is N-type. In another embodiment, the first conductivity type is N-type, and the second conductivity type is P-type.

Figure 4:
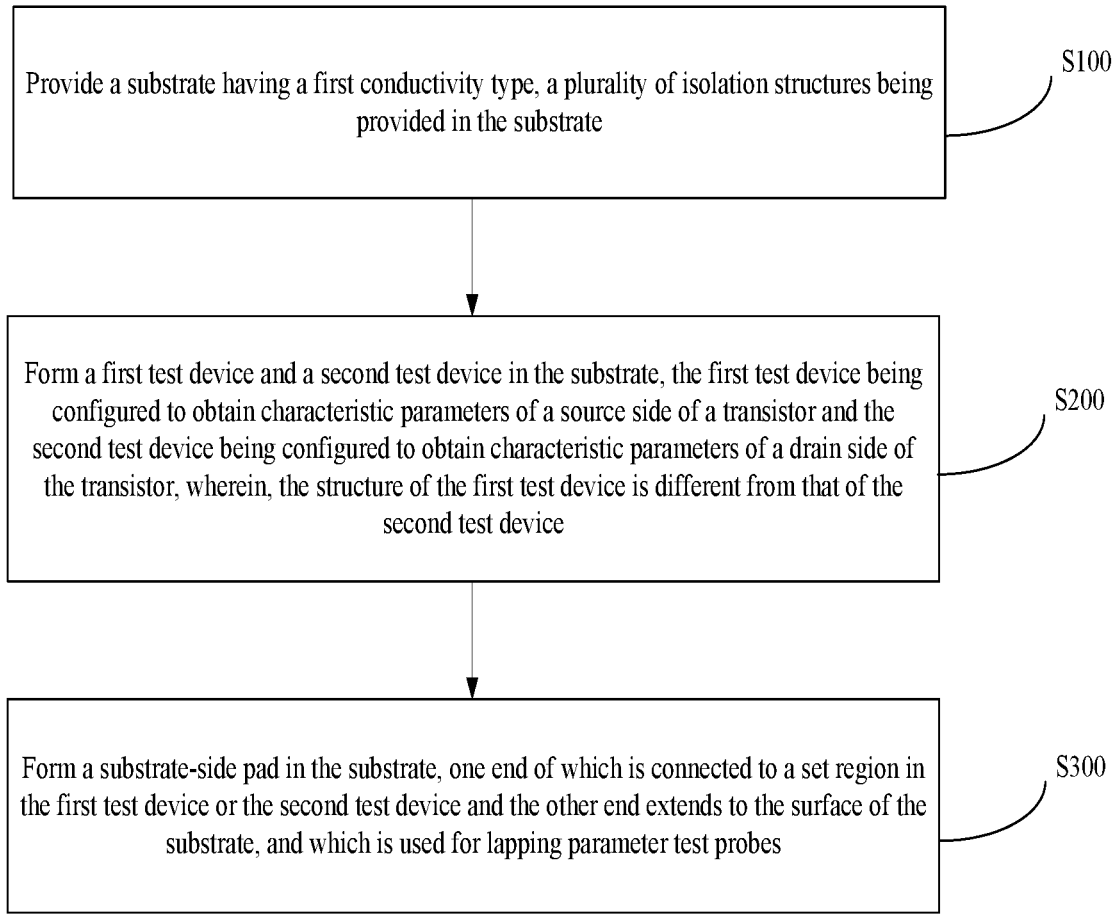
FIG. 4 is a flowchart of a method for preparing a model parameter test structure for a transistor in an embodiment.
Figure 5:
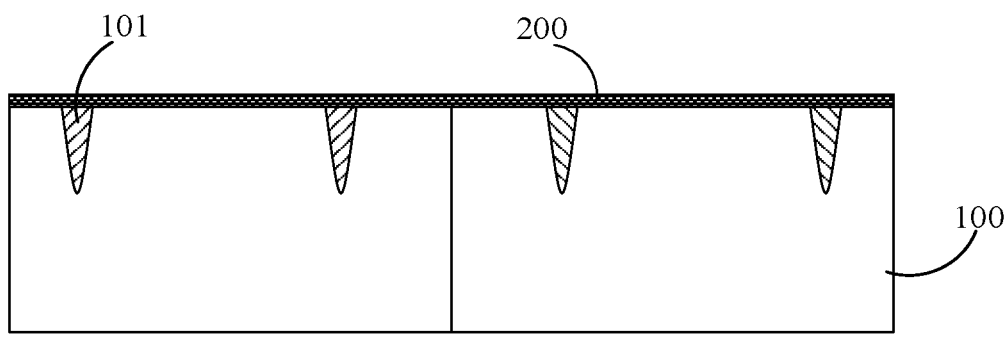
FIG. 5 is a schematic structure diagram of the device after the step S100 in an embodiment.
Figure 8:
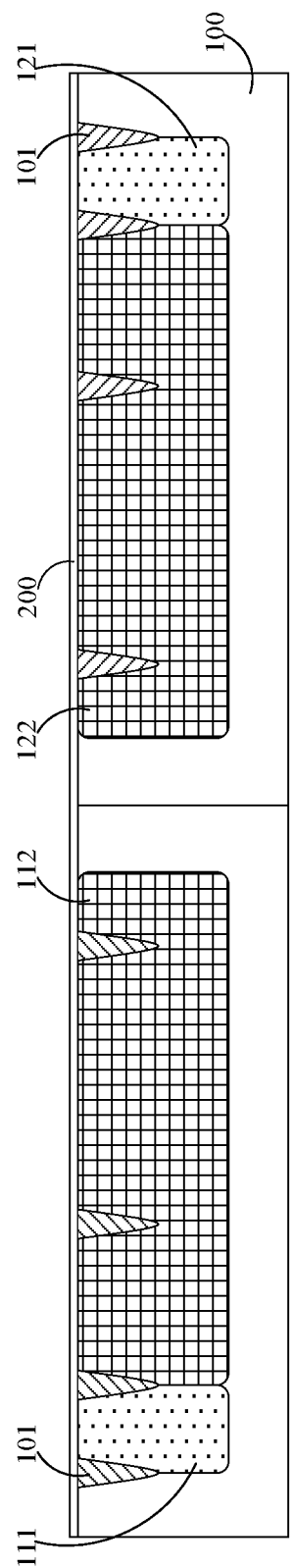
FIG. 8 is a schematic structure diagram of the device after the step S210 in an embodiment.
Figure 9:
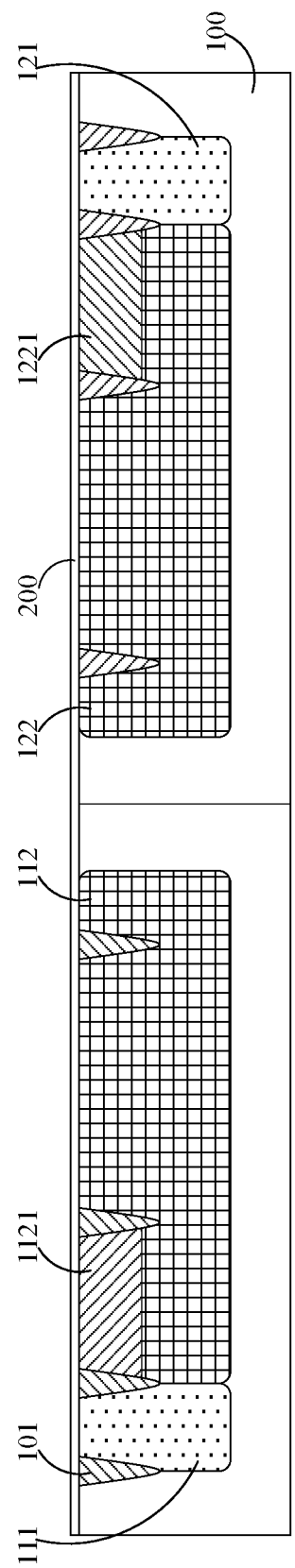
FIG. 9 is a schematic structure diagram of the device after the step S220 in an embodiment.
Figure 10:
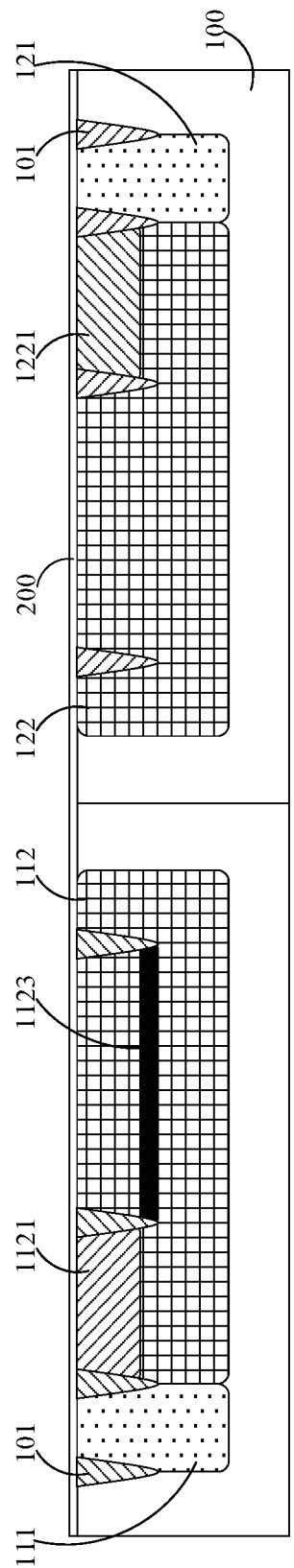
FIG. 10 is a schematic structure diagram of the device after the step S230 in an embodiment.
Figure 11:
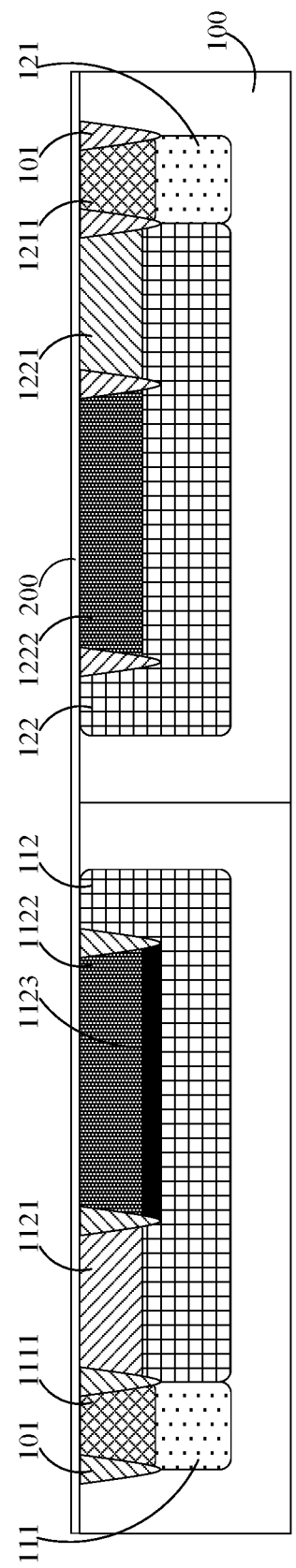
FIG. 11 is a schematic structure diagram of the device after the step S240 in an embodiment.

FIG. 4 is a flowchart of a method for preparing a model parameter test structure for a transistor in an embodiment. As shown in FIG. 4, the preparation method comprises steps S100 to S300. FIG. 5 is a schematic structure diagram of the device after the step S100 in this embodiment. FIG. 6 is a schematic structure diagram of the device after the step S200 in this embodiment, and FIG. 1 is a schematic structure diagram of the device after the step S300 in this embodiment. It should be noted that FIG. 6 shows only the overall outline of the first test device 110 and the second test device 120, not the arrangement of the doped regions and the isolation structures therein.

S100: A substrate 100 having a first conductivity type is provided, a plurality of isolation structures 101 being provided in the substrate 100.

Specifically, as shown in FIG. 5, the isolation structures 101 may be shallow trench isolation structures. Forming the shallow trench isolation structures comprises: etching a trench in the substrate; filling dielectric in the trench; and flattening the surface of the wafer by chemical mechanical polishing. The dielectric, for example silicon oxide, is filled in the trench by chemical vapor deposition. The shallow trench isolation structure is a great isolation process due to its small surface area, compatibility with chemical mechanical polishing, and adaption to requirements on smaller line width and higher integration. It should be noted that the isolation structures 101 in this embodiment are not limited to shallow trench isolation structures, and other isolation structures 101 that can realize isolation are also possible.

In an embodiment, as shown in FIG. 5, before the step S200, the method further comprises: forming a passivation layer 200 on the surface of the substrate 100, the passivation layer 200 being used to protect the substrate 100. The passivation layer 200 may be made of silicon nitride or silicon oxide.

S200: A first test device 110 and a second test device 120 are formed in the substrate 100, the first test device 110 is configured to obtain characteristic parameters of a source side of the transistor, and the second test device 120 is configured to obtain characteristic parameters of a drain side of the transistor; wherein, the structure of the first test device 110 is different from that of the second test device 120.

Specifically, a plurality of doped regions are provided at a set position in the substrate 100 by ion implantation. The plurality of doped regions form the first test device 110 and the second test device 120 shown in FIG. 6 according to the set device structure. Each test device comprises a plurality of doped regions, and the adjacent doped regions are isolated via the isolation structures 101 so as to prevent ion diffusion or leakage current between the adjacent doped regions. Moreover, the preparation method in this embodiment forms the first test device 110 and the second test device 120 with different structures, which avoids the inaccurate electrical parameter test caused by the use of the same test device.

S300: A substrate-side pad 102 is formed in the substrate 100, one end of which is connected to a set region in the first test device 110 or the second test device 120 and the other end extends to the surface of the substrate 100, and which is used for lapping parameter test probes.

Specifically, the substrate-side pad 102 is used for lapping parameter test probes. The parameter test probes are probes of the external test device. The parameter test probes can obtain the electrical performance of the test device by contacting the substrate-side pad 102. Optionally, the substrate-side pad 102 is made of any one of copper, aluminum and tungsten. Further, if a passivation layer 200 is formed on the surface of the substrate 100, the end of the substrate-side pad 102 used for lapping the parameter test probes extends to the surface of the passivation layer 200.

FIG. 7 is a flowchart of forming the first test device 110 and the second test device 120 in the substrate 100 in an embodiment. As shown in FIG. 7, the method comprises steps S210 to S240. FIGS. 8 to 11 are schematic structure diagrams of the device after the steps S210 to S240 in this embodiment.

S210: A first well region 111, a second well region 112, a third well region 121, and a fourth well region 122 are formed in the substrate 100, a side surface of the second well region 112 being isolated from the first well region 111 via the isolation structure 101 and a side surface of the fourth well region 122 being isolated from the third well region 121 via the isolation structure 101.

S220: A first heavily doped region 1121 is formed in the second well region 112, and a fourth heavily doped region 1221 is formed in the fourth well region 122.

S230: A lightly doped region 1123 is formed in the second well region 112, two side surfaces of the lightly doped region 1123 being respectively isolated from the first heavily doped region 1121 and the second well region 112 via the isolation structure 101.

S240: A third heavily doped region 1111 is formed in the first well region 111, a second heavily doped region 1122 is formed in the second well region 112, a sixth heavily doped region 1211 is formed in the third well region 121, and a fifth heavily doped region 1222 is formed in the fourth well region 122.

The first well region 111, the third well region 121, the second heavily doped region 1122, the third heavily doped region 1111, the fifth heavily doped region 1222 and the sixth heavily doped region 1211 all have the first conductivity type, and the second well region 112, the fourth well region 122, the first heavily doped region 1121 and the fourth heavily doped region 1221 all have the second conductivity type.

This embodiment provides a specific implementation of the first test device 110 and the second test device 120. By forming the first test device 110 and the second test device 120 of the junction diode structure, in this embodiment, on the basis of being able to realize the test function, the use of a relatively simple diode device structure can reduce the difficulty in preparing the first test device 110 and the second test device 120, and reduce the failure of the test devices. Therefore, the test efficiency of the test structure in this embodiment is improved.

Various technical features of the above embodiments can be arbitrarily combined. For simplicity, all possible combinations of various technical features of the above embodiments are not described. However, all those technical features shall be included in the protection scope of the present disclosure if not conflict.

The embodiments described above are merely some implementations of the present disclosure. Although those embodiments have been described in specific details, they are not construed as any limitation to the scope of the present disclosure. It should be noted that, for a person of ordinary skill in the art, a number of variations and improvements may be made without departing from the concept of the present disclosure, and those variations and improvements should be regarded as falling into the protection scope of the present disclosure. Therefore, the protection scope of the present disclosure should be subject to the appended claims.

What is claimed is:

1. A model parameter test structure for a transistor, comprising:
   a substrate, having a first conductivity type, a plurality of isolation structures being provided in the substrate and the isolation structures being used to isolate different doped regions;
   a first test device, formed in the substrate and configured to obtain characteristic parameters of a source side of the transistor; and
   a second test device, formed in the substrate and configured to obtain characteristic parameters of a drain side of the transistor;
   wherein, a structure of the first test device is different from a structure of the second test device;

wherein the first test device comprises:
a first well region, having the first conductivity type and being formed in the substrate;
a second well region, having a second conductivity type and being formed in the substrate, a side surface of the second well region being isolated from the first well region via the isolation structure;
a first heavily doped region, having the second conductivity type and being formed in the second well region;
a second heavily doped region, having the first conductivity type and being formed in the second well region, two side surfaces of the second heavily doped region being respectively isolated from the first heavily doped region and the second well region via the isolation structures;
a third heavily doped region, having the first conductivity type and being formed in the first well region; and
a lightly doped region formed in the second well region, the lightly doped region being located on a lower side of the second heavily doped region, and two side surfaces of the lightly doped region being respectively isolated from the first heavily doped region and the second well region via the isolation structures;
wherein the second test device comprises:
a third well region, having the first conductivity type and being formed in the substrate;
a fourth well region, having the second conductivity type and being formed in the substrate, a side surface of the fourth well region being isolated from the third well region via the isolation structure;
a fourth heavily doped region, having the second conductivity type and being formed in the fourth well region;
a fifth heavily doped region, having the first conductivity type and being formed in the fourth well region, two side surfaces of the fifth heavily doped region being respectively isolated from the fourth heavily doped region and the fourth well region via the isolation structures; and
a sixth heavily doped region, having the first conductivity type and being formed in the third well region; and
wherein the lightly doped region only formed in the second well region.

2. The model parameter test structure according to claim 1, wherein a structural difference between the first test device and the second test device matches a structural difference between the source side and the drain side of the transistor to be tested.

3. The model parameter test structure according to claim 2, wherein the first test device and the second test device are both junction diodes.

4. The model parameter test structure according to claim 1, further comprising:
a passivation layer, formed on a surface of the substrate to protect the substrate.

5. The model parameter test structure according to claim 4, further comprising:
a substrate-side pad, one end of the substrate-side pad is connected to a set region in the first test device or the second test device, and the other end of the substrate-side pad extends to a surface of the passivation layer, used for lapping parameter test probes.

6. The model parameter test structure according to claim 2, further comprising:
a passivation layer, formed on a surface of the substrate to protect the substrate.

7. The model parameter test structure according to claim 3, further comprising:
a passivation layer, formed on a surface of the substrate to protect the substrate.

8. The model parameter test structure according to claim 1, further comprising:
a passivation layer, formed on a surface of the substrate to protect the substrate.

9. The model parameter test structure according to claim 1, further comprising:
a passivation layer, formed on a surface of the substrate to protect the substrate.

10. A method for preparing a model parameter test structure for a transistor, comprising:
providing a substrate having a first conductivity type, a plurality of isolation structures being provided in the substrate;
forming a first test device and a second test device in the substrate, the first test device being configured to obtain characteristic parameters of a source side of the transistor and the second test device being configured to obtain characteristic parameters of a drain side of the transistor;
wherein, a structure of the first test device is different from a structure of the second test device;
wherein the forming a first test device and a second test device in the substrate comprises:
forming a first well region, a second well region, a third well region, and a fourth well region in the substrate, a side surface of the second well region being isolated from the first well region via the isolation structure and a side surface of the fourth well region being isolated from the third well region via the isolation structure;
forming a first heavily doped region in the second well region, and forming a fourth heavily doped region in the fourth well region;
forming a lightly doped region in the second well region, two side surfaces of the lightly doped region being respectively isolated from the first heavily doped region and the second well region via the isolation structures;
forming a third heavily doped region in the first well region, forming a second heavily doped region in the second well region, forming a sixth heavily doped region in the third well region, and forming a fifth heavily doped region in the fourth well region;
wherein, the first well region, the third well region, the second heavily doped region, the third heavily doped region, the fifth heavily doped region and the sixth heavily doped region all have the first conductivity type, and the second well region, the fourth well region, the first heavily doped region and the fourth heavily doped region all have the second conductivity type;
wherein the forming a first test device and a second test device in the substrate comprises:
forming a first well region, a second well region, a third well region, and a fourth well region in the substrate, a side surface of the second well region being isolated from the first well region via the isolation structure and a side surface of the fourth well region being isolated from the third well region via the isolation structure;
forming a first heavily doped region in the second well region, and forming a fourth heavily doped region in the fourth well region;
forming a lightly doped region in the second well region, two side surfaces of the lightly doped region being respectively isolated from the first heavily doped region and the second well region via the isolation structures;
forming a third heavily doped region in the first well region, forming a second heavily doped region in the second well region, forming a sixth heavily doped region in the third well region, and forming a fifth heavily doped region in the fourth well region;

wherein, the first well region, the third well region, the second heavily doped region, the third heavily doped region, the fifth heavily doped region and the sixth heavily doped region all have the first conductivity type, and the second well region, the fourth well region, the first heavily doped region and the fourth heavily doped region all have the second conductivity type; and wherein the lightly doped region only formed in the second well region.

11. The method for preparing the model parameter test structure for a transistor according to claim 10, before the forming a first test device and a second test device in the substrate, the method further comprises:

forming a passivation layer on a surface of the substrate, the passivation layer being used to protect the substrate, the method further comprises:

forming a substrate-side pad in the substrate, one end of the substrate-side pad is connected to a set region in the first test device or the second test device and the other end of the substrate-side pad extends to a surface of the passivation layer, used for lapping parameter test probes.

* * * * *